United States Patent
Hsiao et al.

(10) Patent No.: US 9,755,046 B2
(45) Date of Patent: Sep. 5, 2017

(54) METHOD OF FORMING SEMICONDUCTOR DEVICE

(71) Applicant: United Microelectronics Corp., Hsinchu (TW)

(72) Inventors: Shih-Yin Hsiao, Chiayi County (TW); Ching-Chung Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/406,355

(22) Filed: Jan. 13, 2017

(65) Prior Publication Data

US 2017/0125547 A1    May 4, 2017

Related U.S. Application Data

(62) Division of application No. 14/737,186, filed on Jun. 11, 2015, now Pat. No. 9,583,617.

(30) Foreign Application Priority Data

May 18, 2015   (CN) .......................... 2015 1 0251397

(51) Int. Cl.
*H01L 21/02*    (2006.01)
*H01L 29/76*    (2006.01)
*H01L 31/062*    (2012.01)
*H01L 29/66*    (2006.01)
*H01L 29/78*    (2006.01)
*H01L 21/265*    (2006.01)
*H01L 21/311*    (2006.01)

(52) U.S. Cl.
CPC .... *H01L 29/66492* (2013.01); *H01L 21/2652* (2013.01); *H01L 21/31111* (2013.01); *H01L 29/6653* (2013.01); *H01L 29/6656* (2013.01); *H01L 29/7833* (2013.01)

(58) Field of Classification Search
CPC ........... H01L 29/66492; H01L 29/6653; H01L 29/6656; H01L 29/7833; H01L 21/2652; H01L 21/31111
USPC .................................................. 257/408, 291
See application file for complete search history.

(56) References Cited

U.S. PATENT DOCUMENTS

| | | | |
|---|---|---|---|
| 6,194,772 B1 * | 2/2001 | Tung | H01L 29/42368 257/349 |
| 6,525,397 B1 * | 2/2003 | Kalnitsky | H01L 23/5256 257/340 |
| 6,531,347 B1 | 3/2003 | Huster et al. | |
| 7,687,854 B2 | 3/2010 | Park | |
| 8,168,496 B2 | 5/2012 | Hebert | |
| 8,809,150 B2 | 8/2014 | Zhang et al. | |
| 2005/0040490 A1 | 2/2005 | Park | |
| 2005/0148148 A1 | 7/2005 | Cheng | |
| 2005/0224873 A1 | 10/2005 | Yu et al. | |
| 2006/0286757 A1 | 12/2006 | Power et al. | |
| 2007/0045737 A1 * | 3/2007 | Noda | H01L 21/823462 257/347 |

(Continued)

*Primary Examiner* — Dzung Tran
(74) *Attorney, Agent, or Firm* — J.C. Patents

(57) ABSTRACT

A method of forming a semiconductor device is provided. At least two shallow trenches are formed in a substrate. An insulating layer is formed on surfaces of the substrate and the shallow trenches. A conductive layer is formed on the substrate between the shallow trenches. At least one spacer is formed on a sidewall of the conductive layer, wherein the spacer fills up each shallow trench.

10 Claims, 7 Drawing Sheets

(56) References Cited

U.S. PATENT DOCUMENTS

2007/0069326 A1* 3/2007 Yoshizumi ...... H01L 21/823462
                                                    257/500
2007/0096246 A1* 5/2007 Akiba ................. H01L 29/0653
                                                    257/496
2009/0140343 A1    6/2009 Feilchenfeld et al.

* cited by examiner

METHOD OF FORMING SEMICONDUCTOR DEVICE

CROSS-REFERENCE TO RELATED APPLICATION

This application is a divisional application of and claims the priority benefit of U.S. application Ser. No. 14/737,186, filed on Jun. 11, 2015, now allowed, which claims the priority benefit of China application serial no. 201510251397.6, filed on May 18, 2015. The entirety of each of the above-mentioned patent applications is hereby incorporated by reference herein and made a part of this specification.

BACKGROUND OF THE INVENTION

Field of Invention

The present invention is related to an integrated circuit and a method of forming the same, and more particularly to a semiconductor device and a method of forming the same.

Description of Related Art

As technology advances, the semiconductor device is minimized to meet the trend of lighter, thinner, shorter and smaller products. As the size of the semiconductor device is scaled down, the gate thickness becomes less and the spacer width becomes shorter, resulting in high gate-induced drain leakage (GIDL) and severe hot carrier effect.

In the conventional method, the implanting dosage of source/drain extension (SDE) regions is increased to resolve the said issues. However, the sheet resistance and gate-drain overlap capacitance are increased to affect the device performance. Therefore, how to effectively increase the spacer width to alleviate the GIDL and hot carrier effect has drawn high attention in the industry.

SUMMARY OF THE INVENTION

Accordingly, the present invention provides a semiconductor device and a method of forming the same, in which the spacer width can be effectively increased, so the gate-induced drain leakage (GIDL) and hot carrier effect can be significantly reduced.

The present invention provides a semiconductor device including a substrate, an insulating layer, a conductive layer and at least one spacer. The substrate has at least two shallow trenches therein. The conductive layer is disposed on the substrate between the shallow trenches. The insulating layer is disposed between the substrate and the conductive layer. The at least one spacer is disposed on a sidewall of the conductive layer and fills up each shallow trench.

According to an embodiment of the present invention, the conductive layer extends to cover a portion of a bottom of each shallow trench.

According to an embodiment of the present invention, the conductive layer covers about 50% to 80% of the bottom of each shallow trench.

According to an embodiment of the present invention, each shallow trench has a depth of about 100 nm to 600 nm.

According to an embodiment of the present invention, each shallow trench has a width of about 0.1 µm to 0.3 µm.

According to an embodiment of the present invention, the at least one spacer includes a first spacer and a second spacer, the first spacer is disposed on the sidewall of the conductive layer and on a sidewall of each shallow trench and exposes a portion of a bottom of each shallow trench, and the second spacer is disposed on the first spacer.

According to an embodiment of the present invention, the first spacer and the second spacer include different materials.

According to an embodiment of the present invention, the semiconductor device further includes a third spacer disposed on the second spacer.

According to an embodiment of the present invention, the semiconductor device further includes a first doped region disposed in the substrate surrounding each shallow trench.

According to an embodiment of the present invention, the semiconductor device further includes a second doped region disposed in the first doped region at an outer side of each shallow trench.

The present invention further provides a method of forming a semiconductor device. At least two shallow trenches are formed in a substrate. An insulating layer is formed on surfaces of the substrate and the shallow trenches. A conductive layer is formed on the substrate between the shallow trenches. At least one spacer is formed on a sidewall of the conductive layer, wherein the spacer fills up each shallow trench.

According to an embodiment of the present invention, the conductive layer extends to cover a portion of a bottom of each shallow trench.

According to an embodiment of the present invention, the conductive layer covers about 50% to 80% of the bottom of each shallow trench.

According to an embodiment of the present invention, each shallow trench has a depth of 100 nm to 600 nm.

According to an embodiment of the present invention, each shallow trench has a width of 0.1 µm to 0.3 µm.

According to an embodiment of the present invention, the at least one spacer includes a first spacer and a second spacer, the first spacer is formed on the sidewall of the conductive layer and on a sidewall of each shallow trench and exposes a portion of a bottom of each shallow trench, and the second spacer is formed on the first spacer.

According to an embodiment of the present invention, the step of forming the first spacer and the second spacer includes forming a first spacer material layer on the substrate, performing a first anisotropic etching process to the first spacer material layer, forming a second spacer material layer on the substrate, and performing a second anisotropic etching process to the second spacer material layer.

According to an embodiment of the present invention, the shallow trenches are defined with a lightly doped drain (LDD) photomask.

According to an embodiment of the present invention, after the step of forming the shallow trenches and before the step of forming the insulating layer, the method further includes forming a first doped region in the substrate below each shallow trench, and each first doped region is diffused to surround the corresponding shallow trench during the step of forming the insulating layer.

According to an embodiment of the present invention, the method further includes forming a second doped regions respectively in the first doped regions at outer sides of the shallow trenches.

In view of the above, in the present invention, shallow trenches beside the gate are defined with the existing LDD photomask, and then completely filled with spacer(s). In such =ruler, the spacer width can be effectively increased, and therefore the GIDL and hot carrier effect can be significantly reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
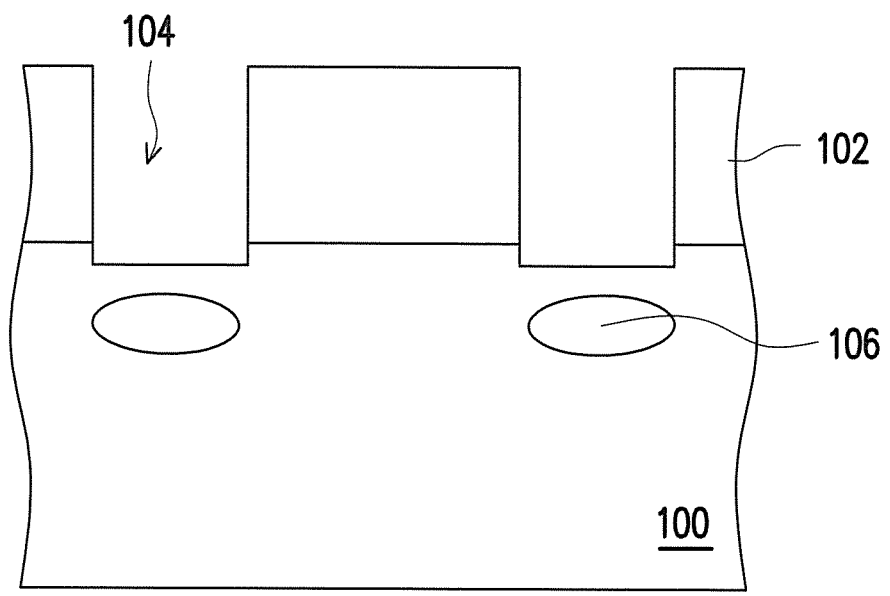
FIG. 1A to FIG. 1I are schematic cross-sectional views of a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1I are schematic cross-sectional views of a method of forming a semiconductor device according to an embodiment of the present invention.

Referring to FIG. 1A, a substrate 100 is provided. The substrate 100 can be a semiconductor substrate, such as a silicon-containing substrate. Thereafter, a patterned photoresist layer 102 is formed on the substrate 100. In an embodiment, a photolithography process with, for example but not limited to, a lightly doped drain (LDD) photomask are used to form the patterned photoresist layer 102. Afterwards, a portion of the substrate 100 is removed by using the patterned photoresist layer 102 as a mask, so as to form at least two shallow trenches 104 in the substrate 100. In other words, the shallow trenches 104 can be defined with, for example but not limited to, a LDD photomask. In an embodiment, each shallow trench 104 has a depth of about 100 nm to about 600 nm and a width of about 0.1 μm to 0.3 μm.

Continue referring to FIG. 1A, a first doped region 106 is formed in the substrate 100 below each shallow trench 104. The method of forming the first doped regions 106 includes performing an ion implantation process by using the patterned photoresist layer 102 as a mask. In an embodiment, each first doped region 106 is separated from the bottom of the corresponding shallow trench 104, as shown in FIG. 1A. However, the present invention is not limited thereto. In another embodiment, each first doped region 106 can be in contact with the bottom of the corresponding shallow trench 104. Thereafter, the patterned photoresist layer 102 is removed.

Figure 1B:
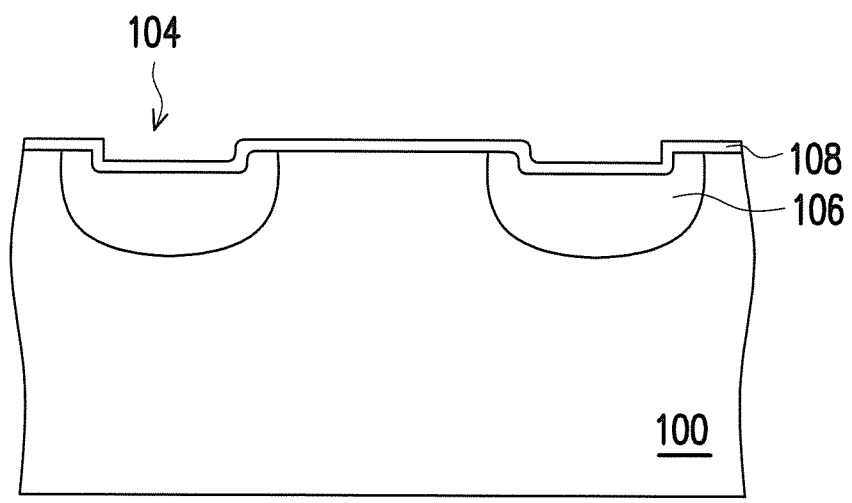

Referring to FIG. 1B, an insulating layer 108 is formed on surfaces of the substrate 100 and the shallow trenches 104. The insulating layer 108 includes silicon oxide, and the forming method thereof includes performing an oxidation process or a suitable deposition process, such as a chemical vapour deposition (CVD) process or an atomic layer deposition (ALD) process. In an embodiment, during the step of forming the insulating layer 108, each first doped region 106 is diffused to surround the corresponding shallow trench 104. Specifically, each first doped region 106 is diffused to cover the bottom and sidewall of the corresponding shallow trench 104.

Figure 1C:
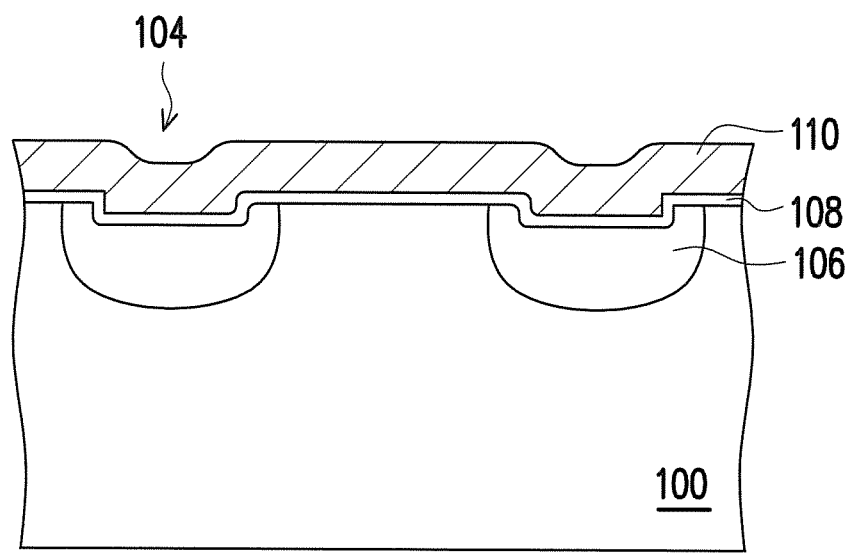

Referring to FIG. 1C, a conductive material layer 110 is formed on the substrate 100 filling in the shallow trenches 104. The conductive material layer 110 includes polysilicon, amorphous silicon or a combination thereof, and the forming method thereof includes performing a suitable deposition process, such as a CVD process or an ALD process.

Figure 1D:
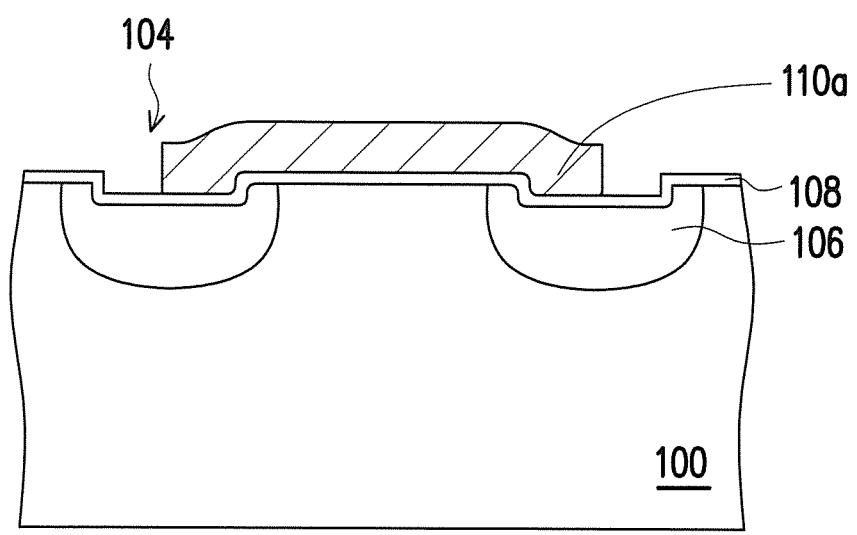

Referring to FIG. 1D, the conductive material layer 110 is patterned to form a conductive layer 110a on the substrate 100 between the shallow trenches 104. The patterning step includes performing photolithography and etching processes. In an embodiment, the insulating layer 108 is substantially not etched in the patterning step, as shown in FIG. 1D. However, the present invention is not limited thereto. In another embodiment, a portion of the insulating layer 108 is simultaneously removed in the patterning step, so the remaining insulating layer 108 is disposed merely between the substrate 100 and the conductive layer 110a. In an embodiment, the conductive layer 110a extends to cover a portion of the bottom of each shallow trench 104. Specifically, one sidewall and a portion of the bottom of each shallow trench 104 is covered by the conductive layer 110a, while the opposite sidewall and another portion of the bottom of the same shallow trench 104 is exposed. In an embodiment, the conductive layer 110a covers at least about 50%, e.g., about 50% to 80%, of the bottom of each shallow trench 104.

Figure 1E:
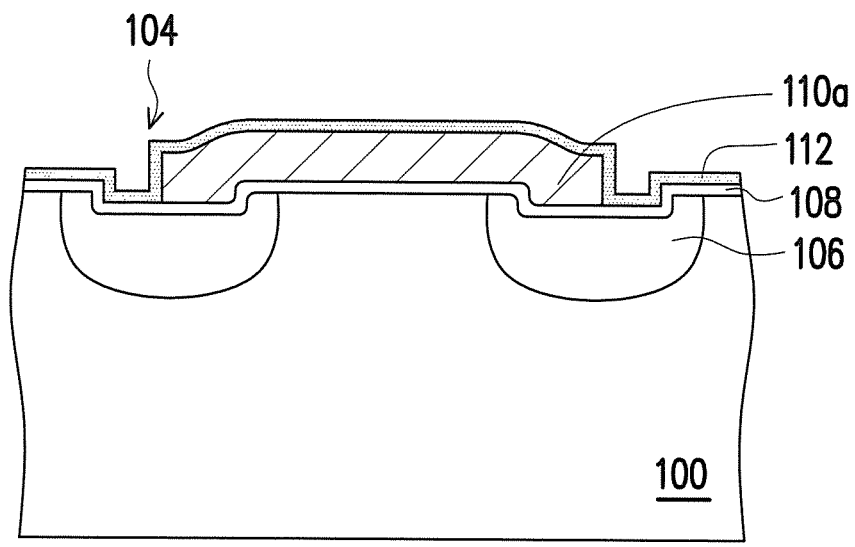

Referring to FIG. 1E, a first spacer material layer 112 is formed on the substrate 100. The first spacer material layer 112 includes silicon nitride, and the forming method thereof includes performing a suitable deposition process, such as a CVD process or an ALD process. In an embodiment, the first spacer material layer 112 covers the top and opposite sidewalls of the conductive layer 110a, and covers the sidewalls and portions of the bottoms of the shallow trenches 104 which are not covered by the conductive layer 110a.

Figure 1F:
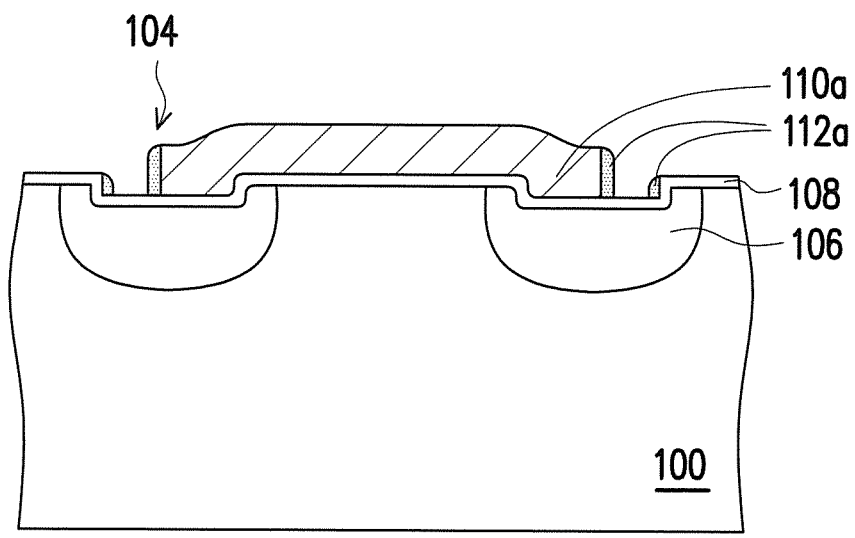

Referring to FIG. 1F, a first anisotropic etching process is performed to the first spacer material layer 112, so as to form a first spacer 112a in each shallow trench 104. The first anisotropic etching process includes a dry etching process. In an embodiment, a first spacer 112a is formed on one sidewall of the conductive layer 110a and on one sidewall of each shallow trench 104 (i.e. the sidewall of each shallow trench 104 not covered by the conductive layer 110a), and exposes a portion of the bottom of the same shallow trench 104.

Figure 1G:
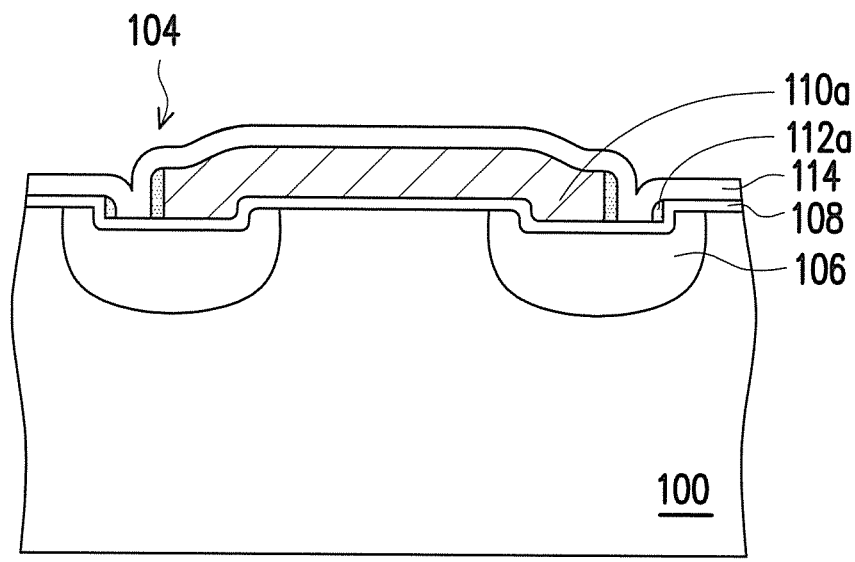

Referring to FIG. 1G, a second spacer material layer 114 is formed on the substrate 100. The second spacer material layer 114 and the first spacer material layer 112 include different materials. The second spacer material layer 114 includes silicon oxide, and the forming method thereof includes performing a suitable deposition process, such as a CVD process or an ALD process. In an embodiment, the second spacer material layer 114 covers the top of the conductive layer 110a and the first spacers 112a, and covers portions of the bottoms of the shallow trenches 104 which are not covered by the conductive layer 110a and the first spacers 112a.

Figure 1H:
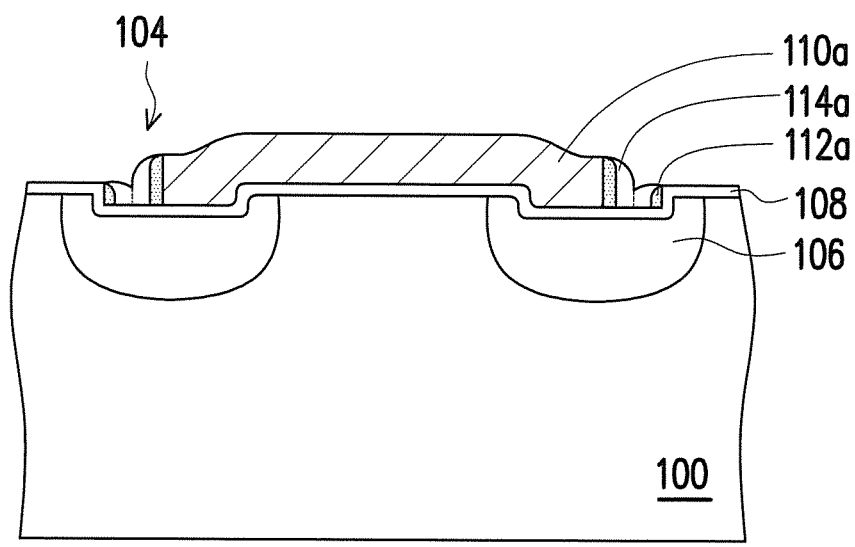

Referring to FIG. 1H, a second anisotropic etching process is performed to the second spacer material layer 114, so as to form a second spacer 114a in each shallow trench 104.

The second anisotropic etching process includes a dry etching process. In an embodiment, the second spacers 114a are formed respectively on the first spacers 112a. Specifically, each second spacer 114a is formed on the inner side of the corresponding first spacer 112a and fills up the corresponding shallow trench 104.

Figure 1I:
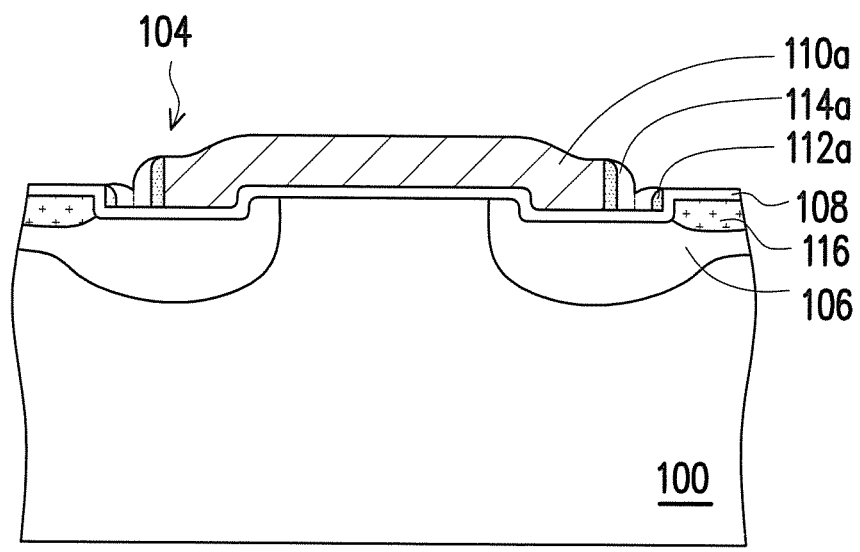

Referring to FIG. 1I, second doped regions 116 are respectively formed in the first doped regions 106 at outer sides of the shallow trenches 104. The method of forming the second doped regions 116 includes performing an ion implantation process followed by a drive-in process. In an embodiment, the profile of the first doped regions 106 is changed during the said drive-in process, as shown in FIG. 1I. The semiconductor device of the present invention is thus completed. In an embodiment, the insulating layer 108 can serve as a gate insulating layer, the conductive layer 110a can serve as a gate, the first doped regions 106 can serve as source/drain extension regions, and the second doped regions 116 can serve as source/drain regions.

In view of the above, in the present invention, the shallow trenches 104 beside the gate (i.e. conductive layer 110a) are defined with the existing LDD photomask, and then completely filled with spacers (i.e. first spacers 112a and second spacers 114a). In such manner, the spacer width can be effectively increased, and therefore the GIDL and hot carrier effect can be significantly reduced.

The said embodiment in which a two-layer spacer (e.g., including a first spacer 112a and a second spacer 114a) fills up each shallow trench adjacent to the gate is provided for illustration purposes, and is not construed as limiting the present invention. People having ordinary skill in the art should appreciate that, the number of layer of the spacer(s) is limited by the present invention. For example, the number of layer of the spacer(s) can be only one, three or more than three, as long as all of the spacer(s) can completely fill the corresponding shallow trench.

Figure 2:
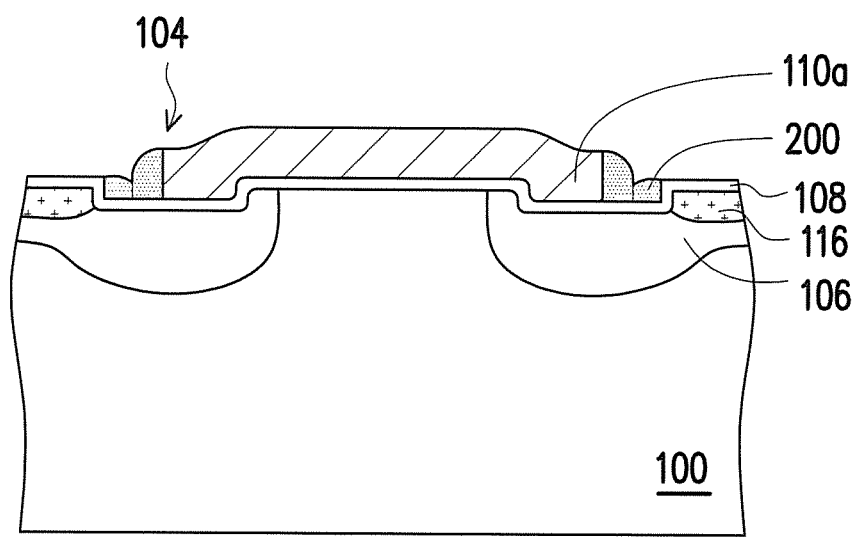
FIG. 2 is a schematic cross-sectional view of a semiconductor device according to another embodiment of the present invention.

In an embodiment, as shown in FIG. 2, when the thickness of a spacer material layer and the width and depth of the shallow trenches 104 are properly adopted, a single spacer 200 is wide enough to fill up each shallow trench 104, and thus, the effect of increasing the spacer width can be achieved.

Figure 3:
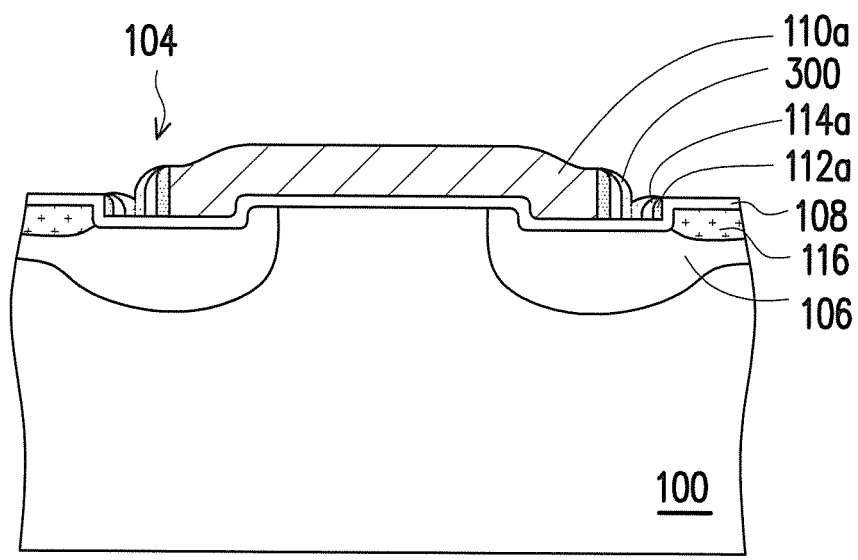
FIG. 3 is a schematic cross-sectional view of a semiconductor device according to yet another embodiment of the present invention.

In another embodiment, as shown in FIG. 3, in the case that the first spacers 112a and the second spacers 114a are not wide enough to fill up the shallow trenches 104, third spacers 300 can be further formed respectively on the second spacers 114a to completely fill the shallow trenches 104, and thus, the effect of increasing the spacer width can be achieved. The method of forming the third spacers 300 includes forming a third spacer material layer on the substrate 100, and performing a third anisotropic etching process to the third spacer material layer.

Figure 4:
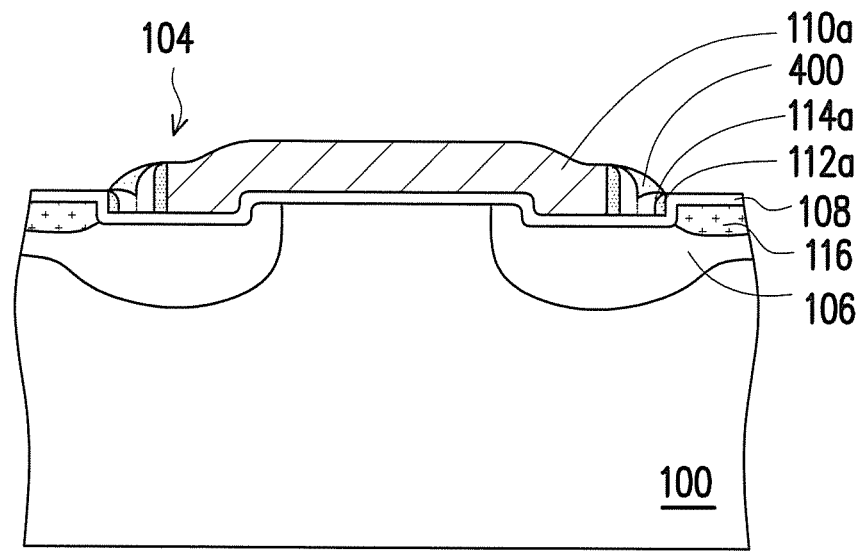
FIG. 4 is a schematic cross-sectional view of a semiconductor device according to still another embodiment of the present invention.

In yet another embodiment, as shown in FIG. 4, even though the first spacers 112a and the second spacers 114a are wide enough to completely fill the shallow trenches 104, third spacers 400 can be optionally formed on the second spacers 114a upon the process requirements, so as to further improve the covering effect.

The structures of the semiconductor devices of the present invention are illustrated below with reference to FIG. 1I and FIG. 2 to FIG. 4. The semiconductor device of the invention includes a substrate 100, first doped regions 106, an insulating layer 108, a conductive layer 110a, second doped regions 116 and at least one spacer. The substrate 100 has at least two shallow trenches 104 therein. The conductive layer 110a is disposed on the substrate 100 between the shallow trenches 104. The insulating layer 108 is disposed between the substrate 100 and the conductive layer 110a. A first doped region 106 is disposed in the substrate 100 around or surrounding each shallow trench 104. The second doped regions 116 are disposed respectively in the first doped regions 106 at outer sides of the shallow trenches 104. Besides, at least one spacer is disposed on one sidewall of the conductive layer 110a and fills up each shallow trench 104.

In an embodiment, the at least one spacer in each shallow trench 104 includes a first spacer 112a and a second spacer 114a, as shown in FIG. 1I. A first spacer 112a is disposed on one sidewall of the conductive layer 110a and on one sidewall of each shallow trench 104 and exposes a portion of the bottom of the same shallow trench 104, and a second spacer 114a is disposed on the first spacer 112a and fills up the same shallow trench 104. Besides, the first spacers 112a and the second spacers 114a include different materials. For example, the first spacers 112a include silicon nitride, and the second spacers 114a include silicon oxide.

In another embodiment, the at least one spacer in each shallow trench 104 is a single spacer 200, as shown in FIG. 2. A single spacer 200 is disposed on one sidewall of the conductive layer 110a and on one sidewall of each shallow trench 104 and fills up each shallow trench 104. The single spacers 200 include silicon nitride.

In yet another embodiment, the at least one spacer in each shallow trench 104 includes a first spacer 112a, a second spacer 114a and a third spacer 300, as shown in FIG. 3. A first spacer 112a is disposed on one sidewall of the conductive layer 110 and on one sidewall of the each shallow trench 104 and exposes a portion of the bottom of the same shallow trench 104, a second spacer 114a is disposed on the first spacer and exposes a portion of the bottom of the same shallow trench 104, and a third spacer 300 is disposed on the second spacer 114a and fills up the same shallow trench 104. Besides, the first spacers 112a include a material different from that of the second spacers 114a, and the second spacers 114a include a material different from that of the third spacers 300. For example, the first spacers 112a include silicon nitride, the second spacers 114a include silicon oxide, and the third spacers 300 include silicon nitride.

In another embodiment, the at least one spacer in each shallow trench 104 includes a first spacer 112a, a second spacer 114a and a third spacer 400, as shown in FIG. 4. The structure of FIG. 4 is similar to that of FIG. 1I, and the difference between them lies in that the structure of FIG. 4 further includes third spacers 400 respectively disposed on the second spacers 114a, so as to further improve the covering effect.

Figure 5:
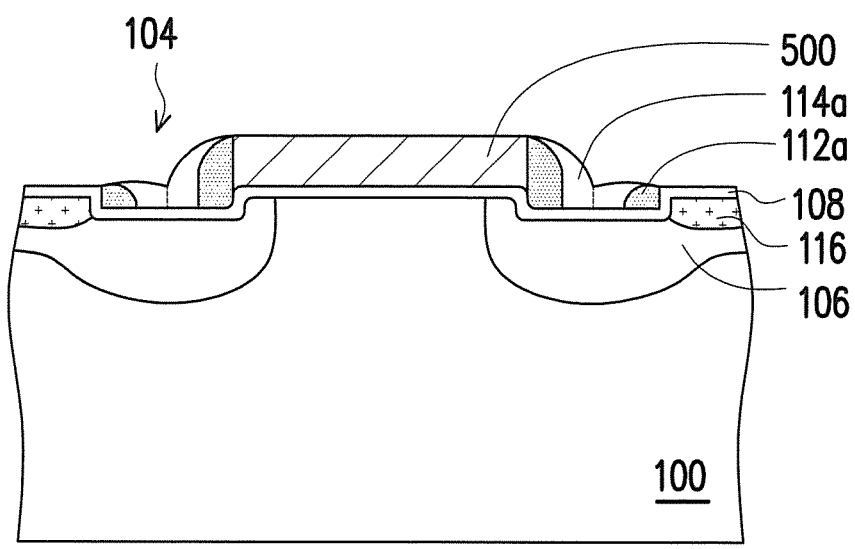
FIG. 5 is a schematic cross-sectional view of a semiconductor device according to another embodiment of the present invention.

Besides, in the structures of FIG. 1I and FIG. 2 to FIG. 4, the conductive layer 110a extends to cover a portion of the bottom of each hallow trench 104. However, the present invention is not limited thereto. In another embodiment, as shown in FIG. 5, the conductive layer 500 is disposed on the substrate merely between the shallow trenches 104, not extending into the bottom of each shallow trench 104. The embodiment of FIG. 5 in which a two-layer spacer (e.g., including a first spacer 112a and a second spacer 114a) fills up each shallow trench 104 is provided for illustration purposes, and is not construed as limiting the present invention. People having ordinary skill in the art should appreciated that a single spacer of FIG. 2 or a tri-layer spacer of FIG. 3 or FIG. 4 can be adopted to replace the two-layer spacer of FIG. 5.

In summary, in the present invention, shallow trenches beside the gate are defined with the existing LDD photomask, and then completely filled with spacer(s). In such manner, the spacer width can be effectively increased. The widened spacer(s) of the present invention can prevent the dopant in the source/drain regions from diffusing to the SDE regions and reserve sufficient space for the source/drain diffusion, so that the punch through and short channel effect (SCE) can be well suppressed. By the method of the invention, the exiting process can be adopted to alleviate the GIDL and hot carrier effect without an additional photomask.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
    forming at least two shallow trenches in a substrate;
    forming an insulating layer on surfaces of the substrate and the shallow trenches;
    forming a conductive layer on the substrate between the shallow trenches; and
    forming at least one spacer on a sidewall of the conductive layer, wherein the shallow trenches are completely filled with the at least one spacer.

2. The method of claim 1, wherein the conductive layer extends to cover a portion of a bottom of each shallow trench.

3. The method of claim 2, wherein the conductive layer covers about 50% to 80% of the bottom of each shallow trench.

4. The method of claim 1, wherein each shallow trench has a depth of 100nm to 600nm.

5. The method of claim 1, wherein each shallow trench has a width of 0.1 μm 0.3 μm.

6. The method of claim 1, wherein the at least one spacer comprises a first spacer and a second spacer, the first spacer is formed on the sidewall of the conductive layer and on a sidewall of each shallow trench and exposes a portion of a bottom of each shallow trench, and the second spacer is formed on the first spacer.

7. The method of claim 6, wherein the step of forming the first spacer and the second spacer comprises:
    forming a first spacer material layer on the substrate;
    performing a first anisotropic etching process to the first spacer material layer;
    forming a second spacer material layer on the substrate; and
    performing a second anisotropic etching process to the second spacer material layer.

8. The method of claim 1, wherein the shallow trenches are defined with a lightly doped drain (LDD) photomask.

9. The method of claim 1, further comprising, after the step of forming the shallow trenches and before the step of forming the insulating layer, forming a first doped region in the substrate below each shallow trench, and each first doped region is diffused to surround the corresponding shallow trench during the step of forming the insulating layer.

10. The method of claim 9, further comprising forming second doped regions respectively in the first doped regions at outer sides of the shallow trenches.

* * * * *